US 6,844,620 B2

(12) United States Patent
Chang et al.

(10) Patent No.: US 6,844,620 B2
(45) Date of Patent: Jan. 18, 2005

(54) POWER LAYOUT STRUCTURE OF MAIN BRIDGE CHIP SUBSTRATE AND MOTHERBOARD

(75) Inventors: Nai-Shung Chang, Taipei Hsien (TW); Shu-Hui Chen, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 238 days.

(21) Appl. No.: 10/183,078

(22) Filed: Jun. 26, 2002

(65) Prior Publication Data

US 2003/0042604 A1 Mar. 6, 2003

Related U.S. Application Data

(60) Provisional application No. 60/315,521, filed on Aug. 28, 2001.

(30) Foreign Application Priority Data

Jan. 31, 2002 (TW) ........................................ 91101626 A

(51) Int. Cl.[7] .............................................. H01L 23/52
(52) U.S. Cl. ........................ 257/691; 257/692; 257/773; 257/774; 257/723
(58) Field of Search ................................ 257/691–692, 257/773–774, 723

(56) References Cited

U.S. PATENT DOCUMENTS 6,531,932 B1 * 3/2003 Govind et al. ................ 333/34

* cited by examiner

Primary Examiner—Luan Thai
(74) Attorney, Agent, or Firm—J.C. Patents

(57) ABSTRACT

The present invention is a placement that is utilized in a 4 layers motherboard and a main bridge chip substrate. The layout adds a placement of the power rings and the power paths on the top signal layer and the bottom solder layer of the main bridge chip on the motherboard, the second layer and the third layer are planned as grounded layers, so that all signals on the top signal layer and the bottom solder layer on the motherboard can easily refer to the grounded layer. The layout of the power ring and the power path on the top signal layer on the motherboard is symmetrical to the layout of the power ring and the power path on the bottom solder layer on the motherboard, and all power paths couple to the corresponding power rings. The power bonding pads/solder balls are arranged on the area where the power rings and the power paths pass through, and the moderate quantity of the grounded bonding pads are arranged on the both sides of the power paths. Regarding to the layout of the main bridge chip substrate, the power of the graphics module, memory, subaltern bridge and APG are placed on the third layer and the bottom layer of the main bridge chip substrate. Moreover, more vias are provided to couple to the power paths.

25 Claims, 6 Drawing Sheets

POWER LAYOUT STRUCTURE OF MAIN BRIDGE CHIP SUBSTRATE AND MOTHERBOARD

CROSS-REFERENCE TO RELATED APPLICATION

This application claims the priority benefit of U.S. provisional application titled "BALLOUT AND SUBSTRATE DESIGN SCHEME FOR CHIPSETS" filed on Aug. 28, 2001, Ser. No. 60/315,521. All disclosures of this application is incorporated herein by reference. This application also claims the priority benefit of Taiwan application serial no. 91101626, filed Jan. 31, 2002.

BACKGROUND OF THE INVENTION

1. Field of Invention

The present invention generally relates to a power layout method and structure of a main bridge chip substrate and a motherboard, and more particularly, to a power layout structure of a 4 layers main bridge chip substrate and a motherboard, so that the main bridge chip can stably operate under the frequency needed by high speed components.

2. Description of Related Art

Accompanying the fast development of new technology, the operating speed of computers is getting faster. Using the Intel Pentium 4 processor as an example, the speed of the CPU bus can reach as high as 532 MHz (133 MHz×4). In contrast, the main bridge chip must provide higher speed on other buses to communicate with the peripheral devices that are coupled to the main bridge chip. These buses comprise the 333 MHz memory bus (166 MHz×2), the 528 MHz AGP bus (66 MHz×8) and the 528 MHz main-subaltern bridge bus (66 MHz×8). In designing the main bridge chip, not only does the high speed operation mentioned above have to be achieved, but the layout of the main bridge chip substrate and the motherboard also have to provide stable operation for the components mentioned above. Usually, there are some basic design procedures that need to be followed in designing the circuit layout of the main bridge chip substrate and the motherboard. For example, in order to stabilize the signal quality on the signal layer, a grounded layer contiguous to the signal layer has to be provided on the main bridge chip substrate and the adjacent motherboard, so that all signals on the signal layer can refer to the grounded layer.

The conventional layout method of the main bridge chip substrate and the motherboard usually generates some signal referrencing problems. FIG. 1 schematically shows a circuit layout of the motherboard and the main bridge chip substrate in the prior art, from up to down it sequentially comprises a top signal layer 11, a grounded layer 12, a power layer 13, and a bottom solder layer 14. In the conventional layout of the motherboard and the main bridge chip substrate, almost all signals are placed on the top signal layer 11, so that all signal lines can refer to the grounded layer 12. On the other hand, different power supplies can be provided by layout and partitioning the power layer 13. Furthermore, the bottom solder layer 14 on the main bridge chip substrate not only provides the solder ball to solder the components on the motherboard, but also provides a place for a small portion of the signal lines that do not need high signal quality. However, when the main bridge chip demands an operating speed with higher frequency (such as more than 1 GHz), since the related controller and interface will consume more power, the layout of the main bridge chip substrate and the motherboard becomes more and more important, and the power layout is the most important topic to be conquered.

FIG. 2 schematically shows a plane of the power layout 200 for the main bridge chip on the power layer 13 of the conventional motherboard. The partition situation of the power layer 13 is also shown in FIG. 2. Furthermore, FIG. 2 also depicts many bonding pads. The bonding pads are located on the top signal layer 11, and couple to the power layer 13 through a via. To be noted, the arrangement of the bonding pads is determined according to the position of related components on the motherboard. The main bridge chip substrate couples to the bonding pad on the motherboard via the solder ball that is placed on the bottom solder layer 14, so that the main bridge chip can obtain the related operating voltage to support its operation.

FIG. 2 further comprises a plurality of working connection areas. The CPU working connection area 201 denotes an area where the bonding pads are located, wherein the bonding pads are used to couple the main bridge chip to the CPU. Besides the signal bonding pads that are coupled to the CPU, it also comprises several grounded bonding pads (the black solid circle) and the CPU power bonding pads (marked as "T"). The CPU power ring 201A denotes a portion that is located within the CPU working connection area 201 and is coupled to the CPU power bonding pads in the power ring of the main bridge chip. Moreover, the memory working connection area 202 denotes an area where the bonding pads are located, wherein the bonding pads are used to couple the main bridge chip to the memory. Besides the signal bonding pads that couple to the memory (such as SDRAM), these bonding pads also comprise several grounded bonding pads and the memory power bonding pads (marked as "M"). The memory power ring 202A denotes a portion that is located within the memory working connection area 202 and is coupled to the memory power bonding pads in the power ring of the main bridge chip. Furthermore, the subaltern bridge working connection area 203 denotes an area where the bonding pads are located, wherein the bonding pads are used to couple the main bridge chip to the subaltern bridge. Besides the signal bonding pads that couple to the subaltern bridge, these bonding pads also comprise several grounded bonding pads and the subaltern bridge power bonding pads (marked as "V"). The subaltern bridge power ring 203A denotes a portion that is located within the subaltern bridge working connection area 203 and is coupled to the subaltern bridge power bonding pads in the power ring of the main bridge chip. The AGP working connection area 204 denotes an area where the bonding pads are located, wherein the bonding pads are used to couple the main bridge chip to the AGP device. Besides the signal bonding pads that couple to the AGP device, these bonding pads also comprise several grounded bonding pads and the AGP power bonding pads (marked as "A"). The AGP power ring 204A denotes a portion that is located within the AGP working connection area 204 and is coupled to the AGP power bonding pads in the power ring of the main bridge chip. The central portion of the circuit layout 200 is the grounded bonding pad area 206. To be noted, the grounded bonding pad and the signal bonding pad in FIG. 2 are denoted with a black solid circle 207 and a while hollow circle 208 respectively.

Although the conventional power layer 13 uses the layout in FIG. 2 for plane partition, as a matter of fact, the power plane after the portioning can not be fully utilized. For example, the area 205 depicts the power path that is the one physically used by the CPU working connection area 201. Since the power path 205 cuts into one side of the CPU working connection area 201, the distribution of the inductance on both sides of the CPU working connection area 201 is not even, resulting in the instability of the power voltage. In other words, the CPU that is far from the power path 205 has higher inductance and the CPU that is near the power path 205 has lower inductance, so the power voltage is not so stable. Moreover, from the power layout in FIG. 2, the width layout of the power ring 201A, 202A, 203A, and 204A on the power layer 13 is not so even. For example, the area that is denoted by the area 202B and 202C have different widths, thus forming a gap of the angles, and these areas have higher inductance. Therefore, in the operation under high speed, the power layer 13 cannot usually provide an immediate current. Consequently, a great ground/bounce effect is generated on the power layer 13, resulting in the instability of the entire high frequency signal, and causing the entire system to malfunction.

SUMMARY OF THE INVENTION

The major objective of the present invention is providing a layout structure of a motherboard, via layout on a 4 layers motherboard, to achieve the objective of providing a stable power and reducing the ground/bounce effect under the high speed operation environment.

The other objective of the present invention is providing a substrate layout structure of a main bridge chip, via layout on a 4 layers main bridge substrate, to provide a power layer and a grounded layer having a greater coverage area, so that the main bridge chip can provide a stable power supply even under high speed operation.

In the 4 layers motherboard of the preferred embodiment according to the present invention, the power rings and the power paths are symmetrically placed on the top signal layer and the bottom solder layer where the main bridge chip is placed, and the second layer and the third layer are planned as the grounded layer, so that all signal layers, power rings, and power paths can handily refer to the grounded layer. The bonding pads/solder balls working as the power are arranged on an area where the power rings and the power paths pass through, and the grounded bonding pads/solder balls that couple to the grounded terminal are placed on both sides of the power paths as the potential reference of the power ring to enhance the power transmission quality. On the power layout that is coupled the CPU to the AGP, the power paths are placed in the center of this area to further couple it to the corresponding power ring. Thus the inductance on both sides of the power paths can not only be symmetrical, so that the falling of the voltage is reduced, and further to provide a more stable current to stably support the high speed operation, but also eliminate the severe ground/bounce effect. Furthermore, the layout of the motherboard, subaltern bridge and the graphics module places the corresponding power bonding pads/solder balls on the power paths.

In the preferred embodiment of the present invention, the third layer and the bottom layer of the main bridge chip substrate are used to place the graphics module, CPU, memory, subaltern bridge and AGP according to the layout of the motherboard, and more Via are also provided for layout in between the power layer and the grounded layer. On the top layer of the main bridge chip substrate, the grounded power ring is placed on the inner ring of the substrate, the graphics module power ring is placed on the outer ring, and the CPU power ring, the memory power ring, the subaltern bridge power ring and the AGP power ring are placed in between the inner ring and the outer ring. The top layer of the main bridge chip substrate is coupled to the third layer and the bottom layer of the main bridge chip substrate through the Via. The graphics module power bonding pads that are distributed scattered on the circuit layout are coupled via the graphics module power ring that is placed on the outer side of the main bridge chip substrate to obtain the needed operating voltage.

In the preferred embodiment of the present invention, in order to control the transmission quality, both of the size of the solder ball and the pitch of the solder balls are decreased to generate more solder balls. The power solder balls are placed on the path where the power ring is placed, so that all the power solder balls can be placed as close as possible, and providing the grounded solder balls are provided on both sides of the power solder balls.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION OF THE PREFERRED EMBODIMENTS

Figure 1:
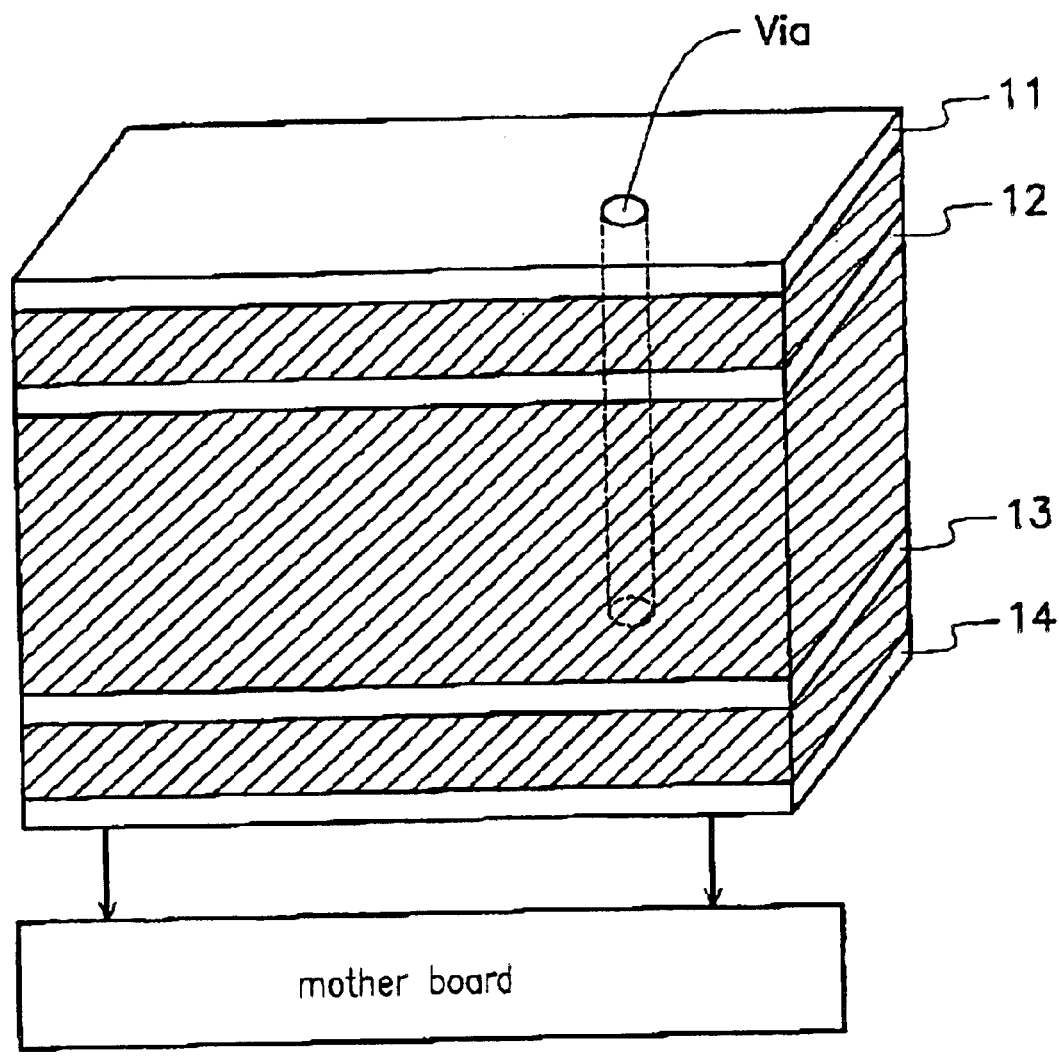
FIG. 1 is a section plane view, schematically showing the circuit layout on the 4 layers printed circuit board.
Figure 2:
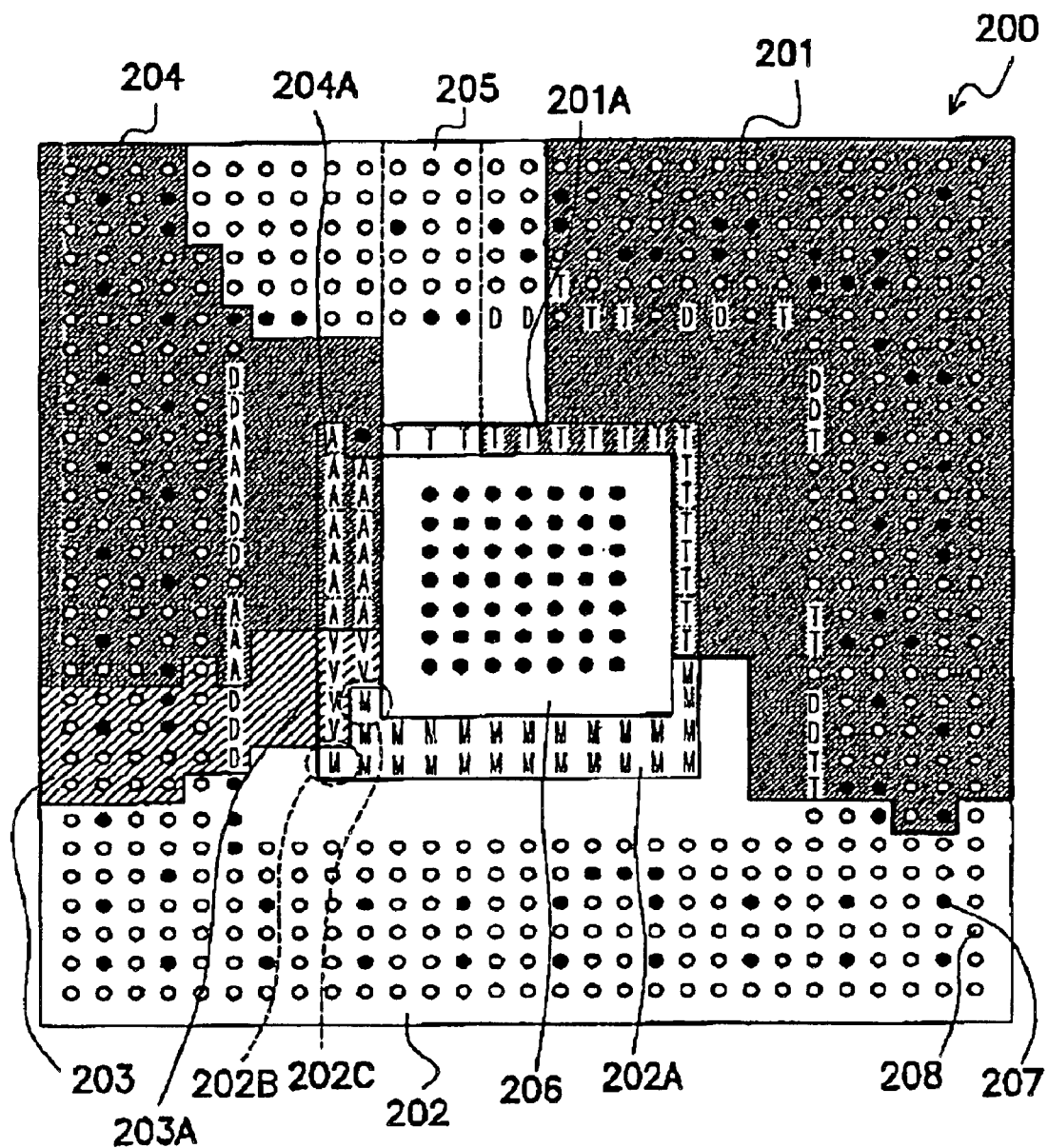
FIG. 2 schematically shows a plane view of the power layout of the motherboard in the prior art.
Figure 3:
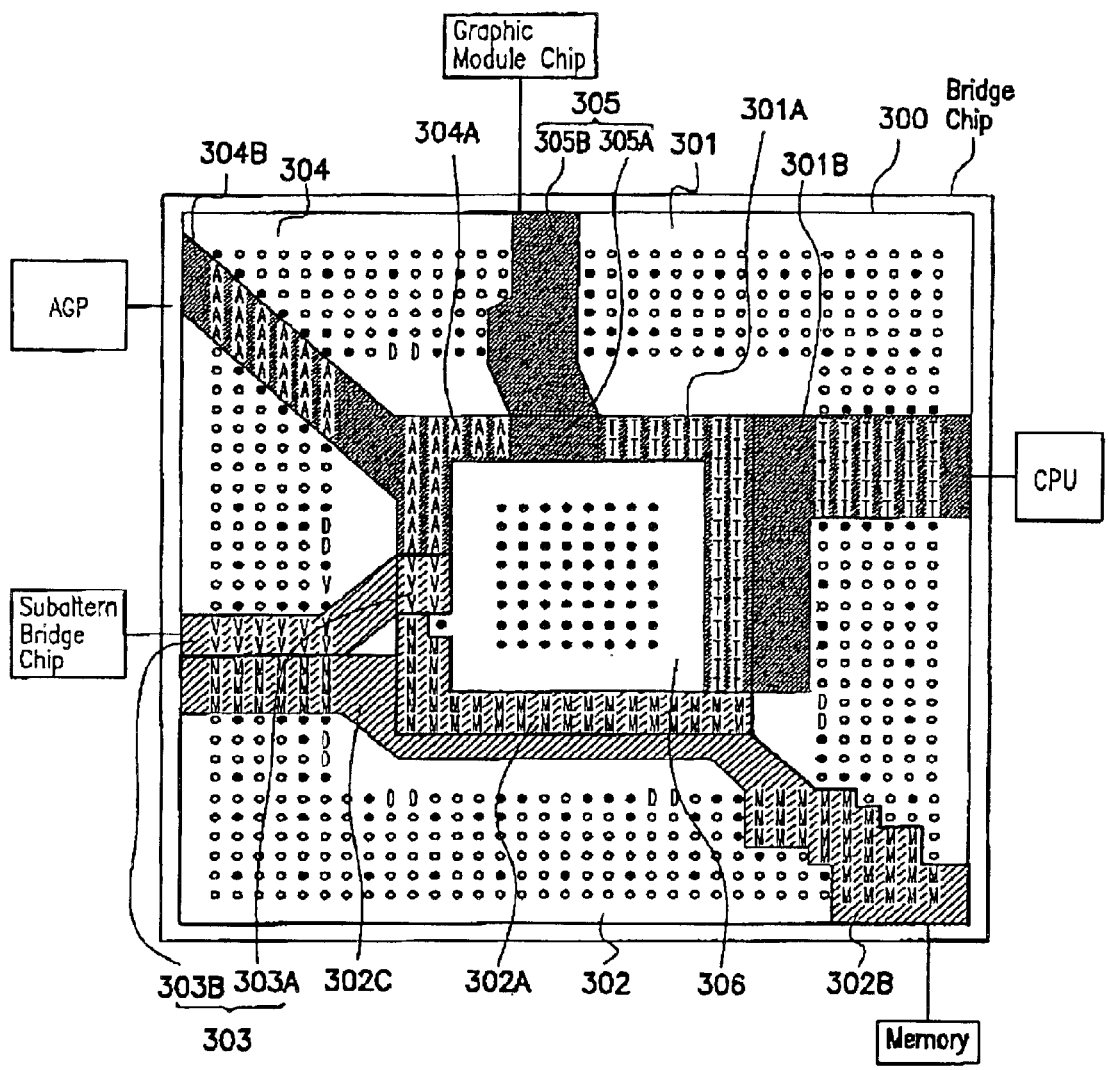
FIG. 3 schematically shows a plane view of the circuit layout on the top signal layer and the bottom solder layer of the motherboard in the preferred embodiment of the present invention.

FIG. 3 schematically shows a plane view of the circuit layout 300 on the top signal layer and the bottom solder layer of the main bridge chip in the preferred embodiment of the present invention, used to denote the power layout situation of the top signal layer and the bottom solder layer of the motherboard. To be noted, the power layout of the top signal layer and the bottom solder layer of the motherboard must be through the vias to generate the junction for extending the area of the power layout, further achieving the objective of providing a stable power supply. Moreover, FIG. 3 also depicts many bonding pads, the arrangement of these bonding pads are determined according to the position of the related components on the motherboard. The main bridge chip substrate is coupled to the motherboard via the solder balls that are arranged on the bottom solder layer, so that the main bridge chip can obtain the needed operating voltage to support its operation.

In FIG. 3, the CPU working connection area 301 denotes an area where the bonding pads are located, wherein the bonding pads are used to couple the main bridge chip to the CPU. Besides the signal bonding pads that couple to the CPU, these solder balls also comprise several grounded bonding pads and the CPU power bonding pads (the one marked as "T"). The CPU power ring denotes a portion that is located within the CPU working connection area 301 and is coupled to the CPU power bonding pads in the power ring of the main bridge chip. The CPU power path 301B is located within the center of the CPU working connection area 301, one side of the CPU power path 301B is coupled to the CPU power ring 301A, and the other side of the CPU power path 301B is coupled to the CPU. The memory working connection area 302 denotes an area where the bonding pads are located, wherein the bonding pads are used to couple the main bridge chip to the memory. Besides the memory power bonding pads (marked as "M"), these bonding pads also comprise the signal bonding pads that couple to the memory and several grounded bonding pads. The memory power ring 302A denotes a portion that is located within the memory working connection area 302 and is coupled to the memory power bonding pads in the power ring of the main bridge chip. Moreover, the memory power path 302B and 302C couple to the memory power ring 302A and the memory (not shown in the diagram) respectively. The subaltern bridge working connection area 303 denotes an area where the power bonding pads are located, wherein the bonding pads are used to couple the main bridge chip to the subaltern bridge. All subaltern bridge power bonding pads (the ones marked as "V") are placed on the subaltern bridge power ring 303A and the subaltern bridge power path 303B. The subaltern bridge power ring 303A denotes a portion that is located within the subaltern bridge working connection area 303 and is coupled to the subaltern bridge power bonding pads in the power ring of the main bridge chip. The AGP working connection area 304 denotes an area where the bonding pads are located, wherein the bonding pads are used to couple the main bridge chip to the AGP device. Besides the AGP power bonding pads (the ones marked as "A"), these bonding pads also comprise the signal spacers that couple to the AGP device and several grounded bonding pads and the AGP power bonding pads. The AGP power ring 304A denotes a portion that is located within the AGP working connection area 304 and is coupled to the AGP power bonding pads in the power ring of the main bridge chip. The AGP power path 304B is located within the center of the AGP working connection area 304, one side of the AGP power path 304B is coupled to the AGP power ring 304A, and the other side of the AGP power path 304B is coupled to the AGP bus (not shown in the diagram). The graphics module working connection area 305 denotes an area where the power bonding pads are located, wherein the bonding pads are used to couple the main bridge chip to the graphics module. All graphics module power bonding pads (marked as "D") are placed on the graphics module power ring 305A and the graphics module power path 305B. The graphics module power ring 305A denotes a portion that is located within the graphics module working connection area 305 and is coupled to the graphics module power bonding pads in the power ring of the main bridge chip. The grounded bonding pad area 306 is totally placed in the center of the whole circuit layout 300, the power ring 301A~305A mentioned above all surround the circumference of the grounded bonding pad area 306. Similarly, the grounded bonding pads and the signal bonding pads in the area 301~305 are denoted with the black solid circle and the white hollow circle respectively. Furthermore, several grounded bonding pads are placed on the both sides of the power path 301B, 302B, 302C, 303, 304B and 305 as the reference of the power path. To be noted, the main bridge chip determines whether to activate the graphics module working connection area 305 according to whether it supports the graphics module or not. For example, when the main bridge chip does not support the graphics function, the graphics module working connection area 305 is deactivated. On the contrary, when the main bridge chip supports the graphics function, the graphics module operates under the voltage provided by the power solder balls, and transmits signals via the signal bonding pads of the graphics module working connection area 305.

According to the power layout in FIG. 3, the power path 301B and 304B are placed in the center of the CPU working connection area 301 and the AGP working connection area 304, rather than on one side of the CPU working connection area 301 and the AGP working connection area 304 as in the prior art, to couple to the power ring. Therefore, with regard to the CPU working connection area 301 (or the AGP working connection area 304), since the power path 301B (or 304B) is placed in the center of the working connection area, not only are the inductances on both sides of the power path 301B (or 304B) symmetrical, since the falling of the voltage from the power path 301B (or 304B) to the edge of the CPU working connection area 301 (or the AGP working connection area 304) is smaller than in the prior art, but also the operation is more stable than in the prior art. Furthermore, the power ring composed of 301A, 302A, 303A, 304A and 305A is rather evenly distributed on the power layout. That is, the fall of the inductance of the power ring is quite small, so that more stable current can be provided. Consequently, the invention is able to support stable high speed operation, and to eliminate the serious ground/bounce effect.

To be noted in the preferred embodiment of the present invention, the power path is placed on the both sides of the memory working connection area 302, rather than placing the power path 301B and 304B in the center of the entire working connection area, as in the CPU working connection area or in the AGP working connection area. The reason for this is that the memory working connection area 302 denotes an area where the bonding pads/solder balls are located, wherein the bonding pads are used to couple the main bridge chip to the memory. The memory (such as SDRAM) usually comprises two power terminals. Therefore, the present invention places the power path 302B and 302C on these two power terminals, so that the fall of the inductances in the entire memory working connection area (i.e. the memory working connection area 302) is within a certain acceptable range.

Figure 4:
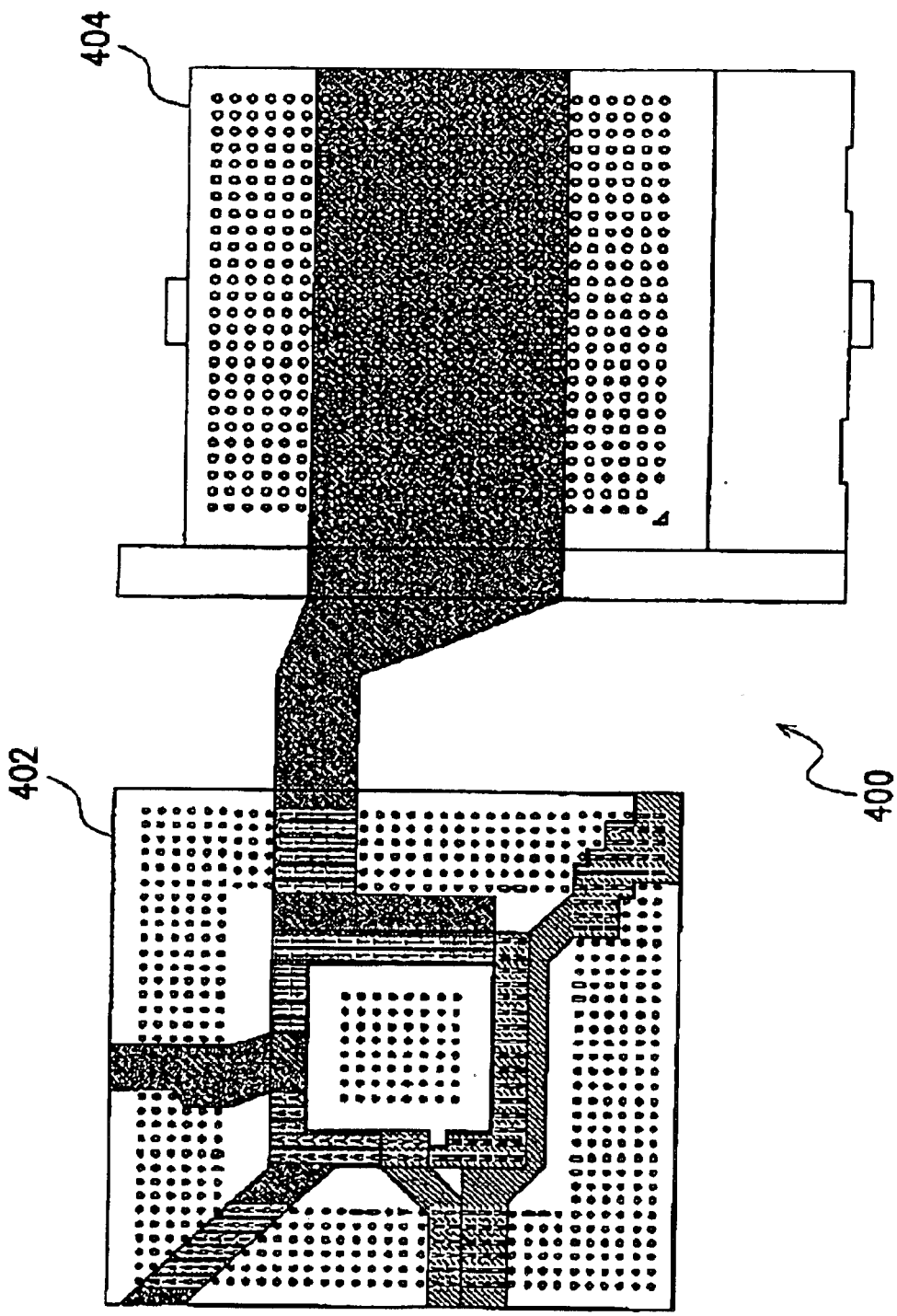
FIG. 4 schematically shows a plane view of the circuit layout on the top signal layer and the bottom solder layer of the motherboard in the preferred embodiment of the present invention to couple the main bridge chip to the CPU.

FIG. 4 schematically shows a plane view of the circuit layout 400 on the top signal layer 402 and the bottom solder layer 404 of the motherboard in the preferred embodiment of the present invention to couple the main bridge chip to the CPU. The Intel Pentium 4 processor (cooperating with the 478 Socket) is exemplified hereinafter. To be noted, only in the area on the motherboard where the main bridge substrate and the CPU are placed, does the power layout on the top signal layer and the bottom solder layer have to be placed like in FIG. 4, the second layer and the third layer planned as the grounded layer. Other areas on the motherboard are placed by using the 4 layers method as in the prior art, that is, the layout is from up to down as signal layer—grounded layer—power layer—solder layer. Since the layout in FIG. 4 is generated according to the specification of the Intel Pentium 4 processor, the power layout of the present invention will provide the best quality of power transmission for the processor.

Since the fact that less quantity of via located within between the power ring and the main bridge chip substrate usually effects the quality of the power transmission, the present invention also provides a solution to this problem. In order to have the power layout proceed smoothly, when the size of the area on the motherboard where the main bridge chip is placed is unchanged (such as when the size of the area of the power layout 300 is unchanged), both the size of the solder ball and the pitch of the solder balls are decreased to obtain more quantity of the solder balls. The VIA P4X266 is exemplified herein, the size of the solder ball is 37.5 mm×37.5 mm, the pitch of the solder balls is 1.27 mm, so the total quantity of the solder balls is 841 (29×29). If the size of the solder ball is decreased to 35 mm×35 mm, the pitch of the solder balls is decreased to 1 mm, thus making it able to obtain the total quantity of the solder ball as 1156 (34×34). Certainly, when the size of the solder ball and the pitch of the solder balls are decreased, the size of the cooperated bonding pad area and the pitch of the cooperated bonding pad areas are also decreased accordingly. Obviously, when the quantity of the solder balls increases, the quantity of the solder balls that can be used as the power solder balls or the grounded solder balls is greater than in the prior art. Therefore, the power layout is more flexible, and the quality of the power transmission can be further enhanced.

Figure 5:
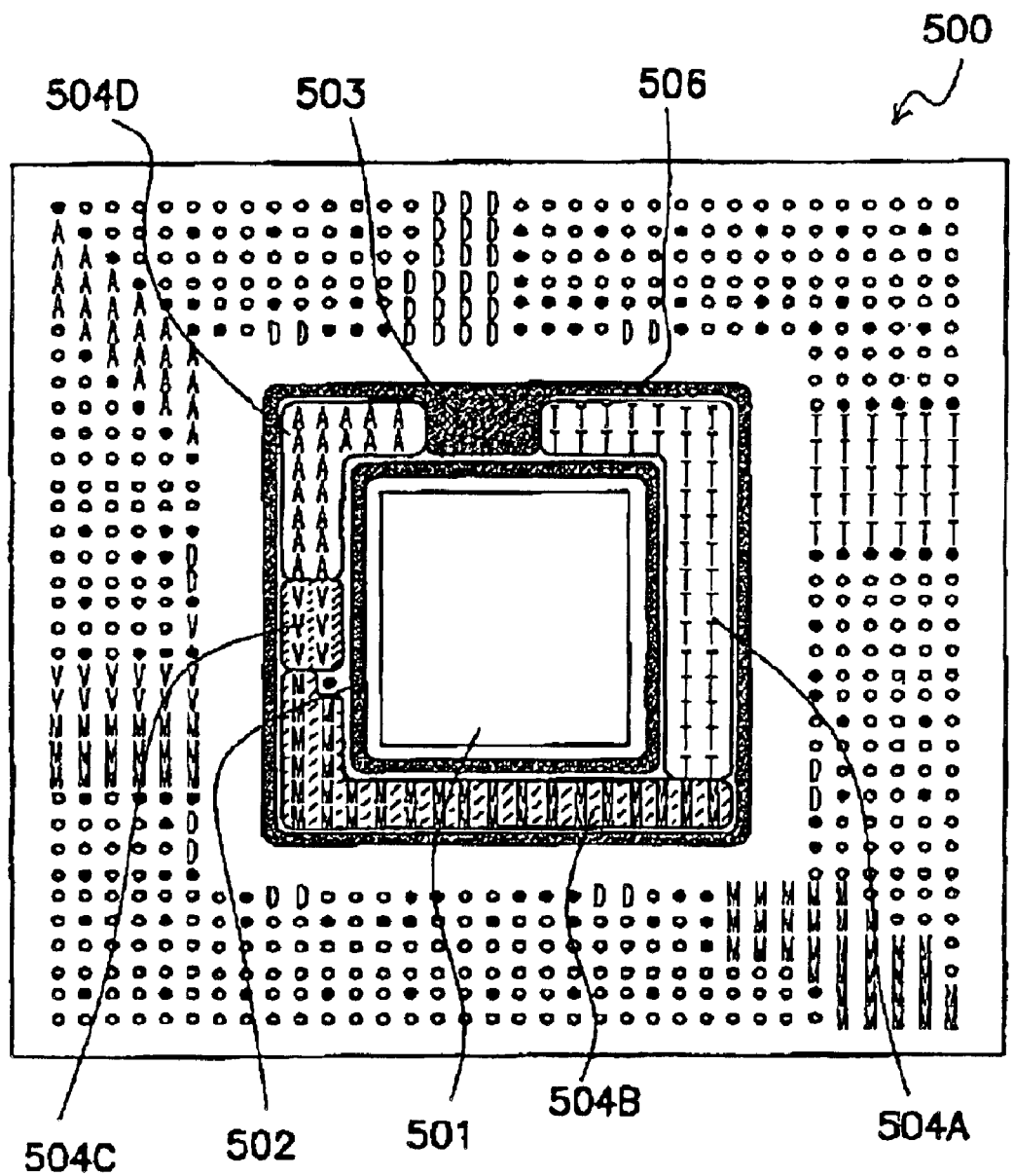
FIG. 5 schematically shows a plane view of the power layout of the top layer of the main bridge chip substrate in the preferred embodiment of the present invention.
Figure 6:
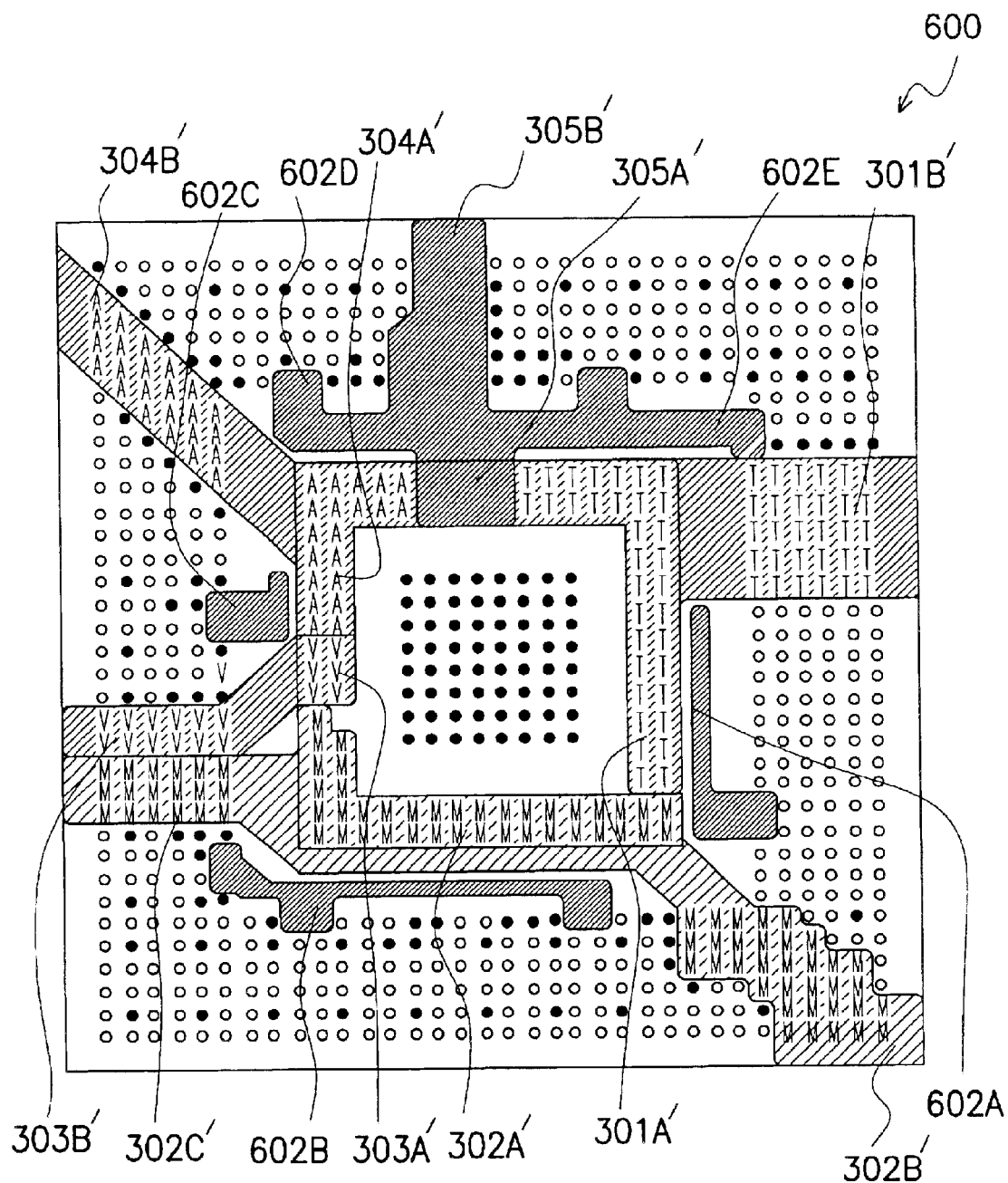
FIG. 6 schematically shows a plane view of the power layout of the third layer and the bottom layer of the main bridge chip substrate in the preferred embodiment of the present invention.

FIG. 5 schematically shows a plane sketch map of the power layout 500 of the top layer of the main bridge chip substrate in the preferred embodiment of the present invention. FIG. 6 schematically shows a plane sketch map of the power layout 600 of the third layer and the bottom layer of the main bridge chip substrate in the preferred embodiment of the present invention. Afterwards, the layout of the main bridge chip substrate will be further described hereinafter.

As shown in FIG. 5, the inner ring of the top layer of the main bridge chip substrate comprises a layout of the grounded power ring 502. The grounded power ring 502 is placed on the periphery of the Die 501. Moreover, the graphics module power ring (VDD) 503 is placed on the outer ring of the top layer of the main bridge chip substrate. The CPU power ring 504A, the memory power ring 504B, the subaltern bridge power ring 504C and the AGP power ring 504D are placed on the area in between the grounded power ring 502 and the graphics module power ring 503. Regarding the circuit layout 302B' and 302C', the subaltern bridge power path 303B', the AGP power path 304B' and the graphics module power path 305B' that respectively is coupled to the power path 301B, 302B, 302C, 303B, 304B and 305B in FIG. 3, but also comprises the CPU power ring 301A', the memory power ring 302A', the subaltern bridge power ring 303A', the AGP power ring 304A' and the graphics chip module power ring 305A' that respectively is coupled to the power ring 301A, 302A, 303A, 304A and 305A in FIG. 3. Moreover, the layout in FIG. 6 also comprises the graphics module power path 602A, 602B, 602C, 602D and 602E that is coupled to the graphics module power ring 503 in FIG. 5 through the via.

To be noted, the circuit layouts shown in FIG. 5~FIG. 6 correspond to the layout in FIG. 3, so that the main bridge chip that is placed on the main bridge chip substrate can couple to the motherboard via the power layout of the main bridge chip substrate. In fact, when the main bridge chip substrate is coupled to the motherboard, the sequence from up to down is as the circuit layout 500 shown in FIG. 5. It is coupled to the power layout 600 of the third layer and the bottom layer of the main bridge chip substrate shown in FIG. 6 through the via. The power layout of the bottom layer of the main bridge chip substrate is coupled to the circuit layout 300 of the signal layer shown in FIG. 3. The circuit layout of the top signal layer is coupled to the circuit layout of the bottom solder layer through the via. Therefore, the main bridge chip can operate after coupling to the motherboard. The detailed connection situation of the power layout is described hereinafter.

The graphics module power ring 503 on the top layer of the main bridge chip substrate is coupled to the graphics module power path 602A~602E on the third layer and the bottom layer of the main bridge chip substrate through the via (therefore, it also is coupled to the graphics module power ring 305A' and the graphics module power path 305B'). Then, it further downwards is coupled to the graphics module working connection area 305 on the motherboard (including the graphics module power ring 305A and the graphics module power path 305B) through the via. The CPU power ring 504A on the top layer of the main bridge chip substrate also is coupled to the CPU power ring 301A' on the third layer and the bottom layer of the main bridge chip substrate through the via. Then, it further downwards is coupled to the CPU power ring 301A and the CPU power path 301B on the motherboard through the via. The memory power ring 504B on the top layer of the main bridge chip substrate also is coupled to the memory power ring 302A' on the third layer and the bottom layer of the main bridge chip substrate through the via. Then, it further downwards is coupled to the memory power ring 302A and the memory power path 302B and 302C on the motherboard through the via. The subaltern bridge power ring 504C on the top layer of the main bridge chip substrate also is coupled to the subaltern bridge power ring 303A' on the third layer and the bottom layer of the main bridge chip substrate through the via. Then, it further downwards is coupled to the subaltern bridge power ring 303A and the subaltern bridge power path 303B on the motherboard through the via. The AGP power ring 504D on the top layer of the main bridge chip substrate also is coupled to the AGP power ring 304A' on the third layer and the bottom layer of the main bridge chip substrate through the via. Then, it further downwards is coupled to the AGP power ring 304A and the AGP power path 304B on the motherboard through the via. Obviously, through the connection from the circuit layout mentioned above, the main bridge chip is able to obtain the needed operating voltage to support its operation.

In summary, the power layout structure of the main bridge chip substrate and the motherboard disclosed by the present invention at least comprises the following advantages. At first, in the circuit layout on the motherboard, increasing a layout for the power ring and the power path on the top layer and the bottom solder layer of the motherboard. The power layer of the top signal layer and the bottom solder layer is further coupled through the via to ensure the stability of the power. The second layer and the third layer of the motherboard are planned as the grounded layer, so that all signals on the top signal layer and the bottom solder layer on the motherboard can handily refer to the grounded layer. Moreover, the grounded bonding pad/solder ball that is coupled to the grounded terminal is placed on both sides of the power paths as the potential reference for the power ring to enhance the quality of the power transmission. Furthermore, the main bridge chip substrate places the graphics module, CPU, memory, subaltern bridge, and AGP on the third layer and the bottom layer of the main bridge chip substrate, and is coupled to the power path and the power ring through more quantity of via, so that the main bridge chip can couple to the motherboard to obtain the needed operating voltage to support its operation.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A power layout structure of a main bridge chip on a motherboard, used to place the main bridge chip on the motherboard to support its operation, the power layout structure of the main bridge chip comprising:
- a first signal layer, located on a top layer of the power layout structure of the main bridge chip, the first signal layer at least comprising a power layout layer;
- a second signal layer, located on a bottom layer of the power layout structure of the main bridge chip, the second signal layer at least comprising a power layout layer, wherein the power layout layer comprised in the first signal layer is symmetrical to the power layout layer comprised in the second signal layer;
- a first reference voltage layer, located below the first signal layer, used to couple to a reference voltage source, wherein the first signal layer is coupled to the first reference voltage layer; and
- a second reference voltage layer, located above the second signal layer, used to couple to the reference voltage source, wherein the second signal layer is coupled to the second reference voltage layer.

2. The power layout structure of the main bridge chip of claim 1, wherein the power layout layer comprised in the first signal layer is coupled to the power layout layer of the corresponding second signal layer through a via.

3. The power layout structure of the main bridge chip of claim 1, wherein the first signal layer comprises a plurality of working connection areas, and each working connection areas at least comprises a power path.

4. The power layout structure of the main bridge chip of claim 3, wherein the power path comprised in the working connection area is placed in the center of the working connection area, wherein the working connection area is a connection area where the main bridge chip is coupled to a CPU or an AGP device.

5. The power layout structure of the main bridge chip of claim 3, wherein the power path comprised in the working connection area is placed on both sides of the working connection area, wherein the working connection area is a connection area where the main bridge chip is coupled to a memory chip.

6. The power layout structure of the main bridge chip of claim 3, wherein the first signal layer comprises a subaltern bridge power path, used to couple the main bridge chip to a subaltern bridge chip, and the second signal layer that corresponds to the method used by the first signal layer to place the subaltern bridge power path symmetrically places the subaltern bridge power path in the second signal layer.

7. The power layout structure of the main bridge chip of claim 3, wherein the first signal layer comprises a graphics module power path, used to couple the main bridge chip to a graphics module chip, and the second signal layer that corresponds to the method used by the first signal layer to place the graphics module power path symmetrically places the graphics module power path in the second signal layer.

8. The power layout structure of the main bridge chip of claim 3, wherein the first signal layer comprises a reference voltage bonding pad area, used to couple to the reference voltage source, the second signal layer that corresponds to the method used by the first signal layer to place the reference voltage bonding pad area symmetrically places a reference voltage solder ball area on the second signal layer, wherein the reference voltage solder ball area is coupled to the reference voltage source.

9. The power layout structure of the main bridge chip of claim 8, wherein each power path is coupled to a power ring, the power ring is placed near the center of the power layout structure of the main bridge chip, wherein all the power rings surround the periphery of the reference voltage bonding pad area.

10. The power layout structure of the main bridge chip of claim 8, wherein the power bonding pad that provides the operating voltage of the working connection area is placed on the power path and on the power ring that is coupled to the power path.

11. The power layout structure of the main bridge chip of claim 3, wherein both sides of the power path comprise a plurality of bonding pads that couple to the reference voltage source, used to provide the reference voltage to the power path.

12. A layout structure of a signal layer, applied in a power layout structure of a main bridge chip on a motherboard, wherein the power layout structure of the main bridge chip places the main bridge chip on the motherboard to support its operation, the layout structure of the signal layer comprising:
- a plurality of working connection areas, each working connection area at least comprising a power path, wherein a power path comprised in the working connection area of a first portion is approximately placed in the center of the working connection area, and power paths comprised in the working connection area of a second portion are approximately placed on both sides of the working connection area;
- a reference voltage bonding pad area, approximately located within the center of the layout structure of the signal layer, wherein a power bonding pad comprised in the reference voltage bonding pad area is coupled to a reference voltage source; and
- a plurality of power rings, located on the periphery of the reference voltage bonding pad area, and each power ring at least is coupled to one power path, wherein each power ring and the power path that is coupled to the power ring form a power layout layer.

13. The layout structure of the signal layer of claim 12, wherein both sides of each power path comprise a plurality of bonding pads that couple to the reference voltage source, used to provide the reference voltage to the power path.

14. The layout structure of the signal layer of claim 12, wherein the working connection area of the first portion is a connection area where the main bridge chip is coupled to a CPU or an AGP device.

15. The layout structure of the signal layer of claim 12, wherein the working connection area of the second portion is a connection area where the main bridge chip is coupled to a memory.

16. The layout structure of the signal layer of claim 12, further comprising:
- a subaltern bridge power path, used to couple the main bridge chip to the subaltern bridge chip; and
- a graphics module power path, used to couple the main bridge chip to the graphics module chip.

17. The layout structure of the signal layer of claim 12, further comprising a layout structure of a bottom signal layer that is located on a bottom layer of the power layout structure of the main bridge chip, the layout structure of the bottom signal layer comprising a plurality of working connection areas, a plurality of power paths, a plurality of power rings, and a reference voltage solder ball area, wherein each power ring and the power path that is coupled to the power ring form a power layout layer, used to provide a different operating voltage to the main bridge chip, and a layout arrangement of the plurality of working connection areas, the plurality of power paths, the plurality of power rings, and the reference voltage solder ball area comprised in the layout structure of the bottom signal layer is symmetrical to a layout arrangement of the plurality of working connection areas, the plurality of power paths, the plurality of power rings, and the reference voltage solder ball area comprised in the layout structure of the signal layer.

18. The layout structure of the signal layer of claim 17, wherein the power layout layer comprised in each layout structure of the signal layer is coupled to the power layout layer of the corresponding layout structure of the bottom signal layer through a via.

19. The layout structure of the signal layer of claim 17, further comprising:
   a first reference voltage layer, located below the layout structure of the signal layer, used to couple to the reference voltage source, wherein the layout structure of the signal layer is coupled to the first reference voltage layer; and
   a second reference voltage layer, located above the layout structure of the bottom signal layer, used to couple to the reference voltage source, wherein the layout structure of the bottom signal layer is coupled to the second reference voltage layer.

20. The layout structure of the signal layer of claim 12, wherein the power bonding pad that provides the operating voltage of the working connection area is placed on the power path and on the power ring that is coupled to the power path.

21. A substrate layout structure of a main bridge chip, used to provide a couple mechanism for the main bridge chip and a power layout structure of the main bridge chip on a motherboard, the power layout structure of the main bridge chip places the main bridge chip on the motherboard to support its operation, wherein the substrate layout structure of the main bridge chip comprises:
   a top layer set, comprising a plurality of power layout layers; and
   a bottom layer set, comprising a plurality of power layout layers, wherein the power layout layer of the bottom layer set is coupled to a corresponding one of the power layout layers of the top layer set and each of the power layout layers of the bottom layer set is coupled to the power layout layers of the layout structure of the corresponding signal layer, used to obtain the operating voltage that is needed by the main bridge chip to drive the main bridge chip to support its operation; and
   a second bottom layer set, comprising a plurality of power layout layers, the power layout layers of the second bottom layer set is symmetrical to the power layout layers of the bottom layer set, wherein each of the power layout layer that is comprised in the second bottom layer set is coupled to one of the power layout layer that corresponds to the bottom layer set and the top layer set through a plurality of vias.

22. The substrate layout structure of the main bridge chip of claim 21, wherein the top layer set comprises:
   an inner power layout layer, coupling to the reference voltage source, wherein the inner power layout layer is placed on the periphery of a Die;
   an outer power layout layer, coupling to a graphics module power ring; and
   a medium power layout layer, located within between the inner power layout layer and the outer power layout layer, the medium power layout layer comprising a plurality of power rings, wherein each power ring provides a different operating voltage to the main bridge chip.

23. The substrate layout structure of the main bridge chip of claim 21, wherein the medium power layout layer comprises a power layout layer of a CPU power ring, a memory power ring, a subaltern bridge power ring, and an AGP power ring.

24. The substrate layout structure of the main bridge chip of claim 21, wherein the bottom layer comprises a graphics module power ring, used to couple to the power layout layer.

25. The substrate layout structure of the main bridge chip of claim 21, wherein the bottom layer comprises:
   a plurality of power paths, each power path coupling to a first signal layer of the power layout structure of the main bridge chip, wherein the first signal layer of the power layout structure of the main bridge chip is located on the top layer of the power layout structure of the main bridge chip; and
   a plurality of power rings, each power ring coupling to the power ring that corresponds to the first signal layer of the power layout structure of the main bridge chip and the power ring that corresponds to the top layer.

* * * * *